US012610618B2

(12) United States Patent
Hu

(10) Patent No.: US 12,610,618 B2
(45) Date of Patent: Apr. 21, 2026

(54) STRETCHABLE DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Li Hu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1218 days.

(21) Appl. No.: 17/605,350

(22) PCT Filed: Sep. 6, 2021

(86) PCT No.: PCT/CN2021/116716
§ 371 (c)(1),
(2) Date: Mar. 2, 2023

(87) PCT Pub. No.: WO2023/024152
PCT Pub. Date: Mar. 2, 2023

(65) Prior Publication Data
US 2024/0030236 A1 Jan. 25, 2024

(30) Foreign Application Priority Data

Aug. 24, 2021 (CN) .......................... 202110973919.9

(51) Int. Cl.
*H01L 27/15* (2006.01)
*H01L 25/075* (2006.01)
(Continued)

(52) U.S. Cl.
CPC ......... *H10D 86/60* (2025.01); *H01L 25/0753* (2013.01); *H01L 25/167* (2013.01); *H10D 86/443* (2025.01); *H10H 29/142* (2025.01)

(58) Field of Classification Search
CPC ...... H10K 77/10–111; H10K 2102/311; G09G 2380/02
See application file for complete search history.

(56) References Cited

U.S. PATENT DOCUMENTS

2019/0280077 A1* 9/2019 Park ..................... H10K 77/111
2019/0296097 A1* 9/2019 Hong ................... H10K 59/124

FOREIGN PATENT DOCUMENTS

CN     110289292 A     9/2019
CN     110459571 A     11/2019
(Continued)

OTHER PUBLICATIONS

Chinese Office Action issued in corresponding Chinese Patent Application No. 202110973919.9 dated Apr. 2, 2022, pp. 1-8.
(Continued)

*Primary Examiner* — Ismail A Muse
(74) *Attorney, Agent, or Firm* — PV IP PC; Christopher S. Ruprecht; Wei Te Chung

(57) ABSTRACT

A stretchable display panel is disclosed, which includes a first flexible support layer, a plurality of pixel islands and a plurality of connecting bridges disposed on the first flexible support layer, and a plurality of hollow areas, wherein each of the hollow areas is provided with a first opening, and the first opening is filled with a stretchable material. Embodiments of the present application can reduce Young's modulus of the entire stretchable display panel, increase stretchability of the stretchable display panel, and can suppress the stretchable display panel from being twisted and deformed when stretched.

18 Claims, 8 Drawing Sheets

(51) Int. Cl.

| | | |
|---|---|---|
| *H01L 25/16* | (2023.01) | |
| *H01L 29/26* | (2006.01) | |
| *H01L 31/12* | (2006.01) | |
| *H01L 33/00* | (2010.01) | |
| *H10D 86/40* | (2025.01) | |
| *H10D 86/60* | (2025.01) | |
| *H10H 29/14* | (2025.01) | |

(56) References Cited

FOREIGN PATENT DOCUMENTS

| | | | |
|---|---|---|---|
| CN | 111370454 | A | 7/2020 |
| CN | 111799392 | A | 10/2020 |
| CN | 111863901 | A | 10/2020 |
| CN | 111864067 | A | 10/2020 |
| CN | 111968522 | A | 11/2020 |
| CN | 112310123 | A | 2/2021 |
| CN | 112530864 | A | 3/2021 |
| CN | 112863342 | A | 5/2021 |
| KR | 20210047199 | A | 4/2021 |

OTHER PUBLICATIONS

International Search Report in International application No. PCT/CN2021/116716, mailed on May 19, 2022.
Written Opinion of the International Searching Authority in International application No. PCT/CN2021/116716, mailed on May 19, 2022.

\* cited by examiner

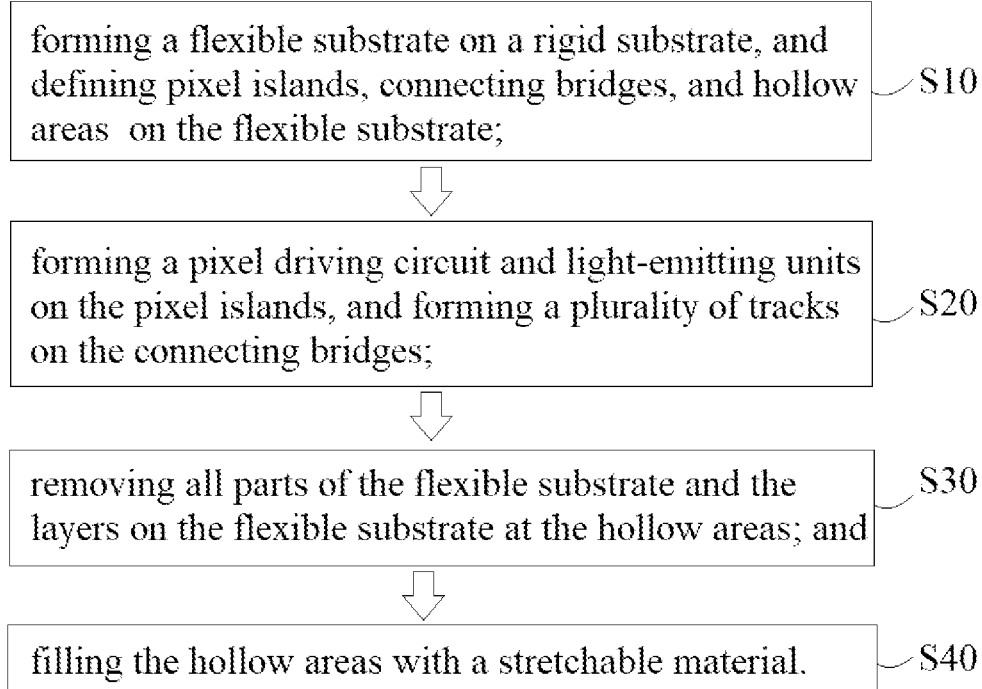

| forming a flexible substrate on a rigid substrate, and defining pixel islands, connecting bridges, and hollow areas on the flexible substrate; | S10 |

| forming a pixel driving circuit and light-emitting units on the pixel islands, and forming a plurality of tracks on the connecting bridges; | S20 |

| removing all parts of the flexible substrate and the layers on the flexible substrate at the hollow areas; and | S30 |

| filling the hollow areas with a stretchable material. | S40 |

FIG. 5

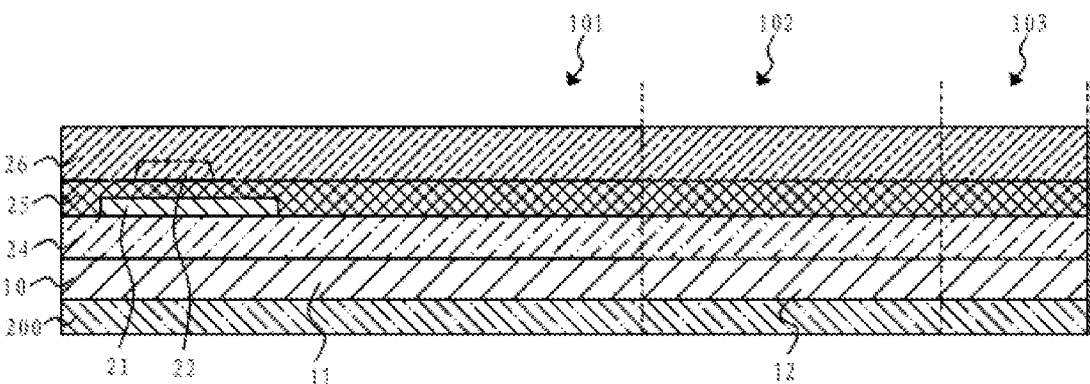

FIG. 6

STRETCHABLE DISPLAY PANEL

RELATED APPLICATIONS

This application is a Notional Phase of PCT Patent Application No. PCT/CN2021/116716 having international filing date of Sep. 6, 2021, which claims the benefit of priority of Chinese Patent Application No. 202110973919.9 filed on Aug. 24, 2021. The contents of the above applications are all incorporated by reference as if fully set forth herein in their entirety.

BACKGROUND OF INVENTION

Field of Invention

The present application relates to a field of display technology, and in particular to a stretchable display panel.

With development of internet of things technology, consumer electronics will be more and more integrated into our lives, and these objects are usually not necessarily 2D, so development of 3D free-form surface display technology is required. However, a foldable and bendable display screen only realizes the display function in a certain spatial direction, and does not realize an effect of flexible display in any direction in a global space. Research on a stretchable display device to achieve stretching in any direction while ensuring a good display effect, will be a focus of research on a next generation of novel global space flexible display research.

How to realize the stretching of the stretchable display panel in any direction while ensuring not to break the stretchable display panel by the stretching is still one of difficulties in current research and development of stretchable display products.

SUMMARY OF INVENTION

An embodiment of the present application provides a stretchable display panel to solve the technical problem that the existing stretchable display panel may be broken when stretched in an arbitrary direction.

In order to solve the above problems, the technical solutions provided by the present application are as follows:

An embodiment of the present application provides a stretchable display panel, including:

a first flexible support layer;

a plurality of pixel islands disposed on the first flexible support layer, wherein each of the pixel islands includes a plurality of light-emitting units;

a plurality of connecting bridges disposed on the first flexible support layer, wherein each of the connecting bridges connects adjacent ones of the pixel islands, each of the connecting bridges includes a plurality of traces, and opposite ends of each of the traces are electrically connected to the light-emitting units in adjacent ones of the pixel islands, respectively;

a plurality of hollow areas defined between adjacent ones of the connecting bridges, and/or defined between adjacent ones of the pixel islands; and a second flexible support layer disposed on a side of the pixel islands and the connecting bridges away from the first flexible support layer, wherein each of the hollow areas is provided with a first opening, the first opening is filled with a stretchable material, and the stretchable material is disposed on a side of the first flexible support layer close to the pixel islands;

wherein each of the pixel islands includes a substrate island, a pixel driving circuit, and the light-emitting units sequentially stacked on the first flexible support layer, and the light-emitting units are electrically connected to the pixel driving circuit; and wherein each of the connecting bridges further includes a substrate bridge and the plurality of traces sequentially stacked on the first flexible support layer, and opposite ends of the substrate bridge are respectively connected to adjacent ones of the substrate island.

In some embodiments of the present application, the stretchable display panel further includes an active layer, a first metal layer, and a second metal layer disposed on the substrate island and arranged in different layers, and at least one inorganic layer is provided between every adjacent ones of the substrate island, the active layer, the first metal layer, and the second metal layer, wherein each of the connecting bridges further includes a second opening, the second opening penetrates through multiple inorganic layers, the second opening is filled with an organic filling layer, and the organic filling layer is disposed between the substrate bridge and the traces.

In some embodiments of the present application, the second metal layer includes a source/drain layer of the pixel driving circuit and the traces.

In some embodiments of the present application, the stretchable display panel further includes:

a buffer layer disposed on the substrate island;

the active layer disposed on the buffer layer;

a gate insulating layer disposed on the active layer;

the first metal layer disposed on the gate insulating layer;

an interlayer insulating layer disposed on the first metal layer; and the second metal layer disposed on the interlayer insulating layer, wherein the buffer layer, the gate insulating layer, the interlayer insulating layer, and the interlayer insulating layer are all inorganic layers, and the second opening penetrates the interlayer insulating layer, the gate insulating layer, and the buffer layer.

In some embodiments of the present application, the stretchable display panel further includes:

a planarization layer disposed on the second metal layer, and the light-emitting units being disposed on the planarization layer; and a passivation layer disposed on the planarization layer, wherein the first opening penetrates the passivation layer, the planarization layer, the second metal layer, the interlayer insulating layer, the first metal layer, the gate insulating layer, the active layer, and the buffer layer.

In some embodiments of the present application, the stretchable material filled in the first opening is an optical clear adhesive (OCA).

In some embodiments of the present application, the planarization layer is an organic layer, and the planarization layer extends to the connecting bridges and covers the plurality of traces of the connecting bridges.

In some embodiments of the present application, the stretchable material is configured to provide bonding between the first flexible support layer and the pixel islands, between the first flexible support layer and the connecting bridges, between the first flexible support layer and the connecting bridges, and between the second flexible support layer and the connecting bridges.

Another embodiment of the present application also provides an stretchable display panel, including:

a first flexible support layer;

a plurality of pixel islands disposed on the first flexible support layer, wherein each of the pixel islands includes a plurality of light-emitting units;

a plurality of connecting bridges disposed on the first flexible support layer, wherein each of the connecting bridges connects adjacent ones of the pixel islands, each of the connecting bridges includes a plurality of traces, and opposite ends of each of the traces are electrically connected to the light-emitting units in adjacent ones of the pixel islands, respectively; and a plurality of hollow areas defined between adjacent ones of the connecting bridges, and/or defined between adjacent ones of the pixel islands, wherein each of the hollow areas is provided with a first opening, the first opening is filled with a stretchable material, and the stretchable material is disposed on a side of the first flexible support layer close to the pixel islands.

In some embodiments of the present application, each of the pixel islands includes a substrate island, a pixel driving circuit, and the light-emitting units sequentially stacked on the first flexible support layer, and the light-emitting units are electrically connected to the pixel driving circuit; wherein each of the connecting bridges further includes a substrate bridge and the plurality of traces sequentially stacked on the first flexible support layer, and opposite ends of the substrate bridge are respectively connected to adjacent ones of the substrate island.

In some embodiments of the present application, the stretchable display panel further includes an active layer, a first metal layer, and a second metal layer disposed on the substrate island and arranged in different layers, and at least one inorganic layer is provided between every adjacent ones of the substrate island, the active layer, the first metal layer, and the second metal layer; wherein each of the connecting bridges further includes a second opening, the second opening penetrates through multiple inorganic layers, the second opening is filled with an organic filling layer, and the organic filling layer is disposed between the substrate bridge and the traces.

In some embodiments of the present application, the second metal layer includes a source/drain layer of the pixel driving circuit and the traces.

In some embodiments of the present application, the stretchable display panel further includes:

a buffer layer disposed on the substrate island;

the active layer disposed on the buffer layer;

a gate insulating layer disposed on the active layer;

the first metal layer disposed on the gate insulating layer;

an interlayer insulating layer disposed on the first metal layer; and the second metal layer disposed on the interlayer insulating layer, wherein the buffer layer, the gate insulating layer, the interlayer insulating layer, and the interlayer insulating layer are all inorganic layers, and the second opening penetrates the interlayer insulating layer, the gate insulating layer, and the buffer layer.

In some embodiments of the present application, the stretchable display panel further includes:

a planarization layer disposed on the second metal layer, and the light-emitting units being disposed on the planarization layer; and a passivation layer disposed on the planarization layer, wherein the first opening penetrates the passivation layer, the planarization layer, the second metal layer, the interlayer insulating layer, the first metal layer, the gate insulating layer, the active layer, and the buffer layer.

In some embodiments of the present application, the stretchable material filled in the first opening is an optical clear adhesive (OCA).

In some embodiments of the present application, the planarization layer is an organic layer, and the planarization layer extends to the connecting bridges and covers the plurality of traces of the connecting bridges.

Embodiments of the present application provide a stretchable display panel and a stretchable display device. The stretchable display panel includes a first flexible support layer, pixel islands and connecting bridges disposed on the first flexible support layer, and hollow areas between adjacent ones of the connecting bridges and/or between adjacent ones of the pixel islands; each of the pixel islands is provided with a first opening, and the first opening is filled with a stretchable material. By designing peripheral areas of the pixel islands and the connecting bridges as the hollow areas with a first opening, a Young's modulus of the entire stretchable display panel can be reduced and a stretchability of the stretchable display panel can be increased. Filling the first opening with the stretchable material can prevent the stretchable display panel from breaking when stretched and can suppress the stretchable display panel from being twisted and deformed when stretched.

BRIEF DESCRIPTION OF DRAWINGS

FIG. 5 is a flowchart of steps of a method of manufacturing a stretchable display panel provided by an embodiment of the present application.

FIG. 6 to FIG. 13 are schematic diagrams of film structures in a manufacturing process of the stretchable display panel provided by the embodiments of the present application.

DETAILED DESCRIPTION OF PREFERRED EMBODIMENTS

Figure 1:
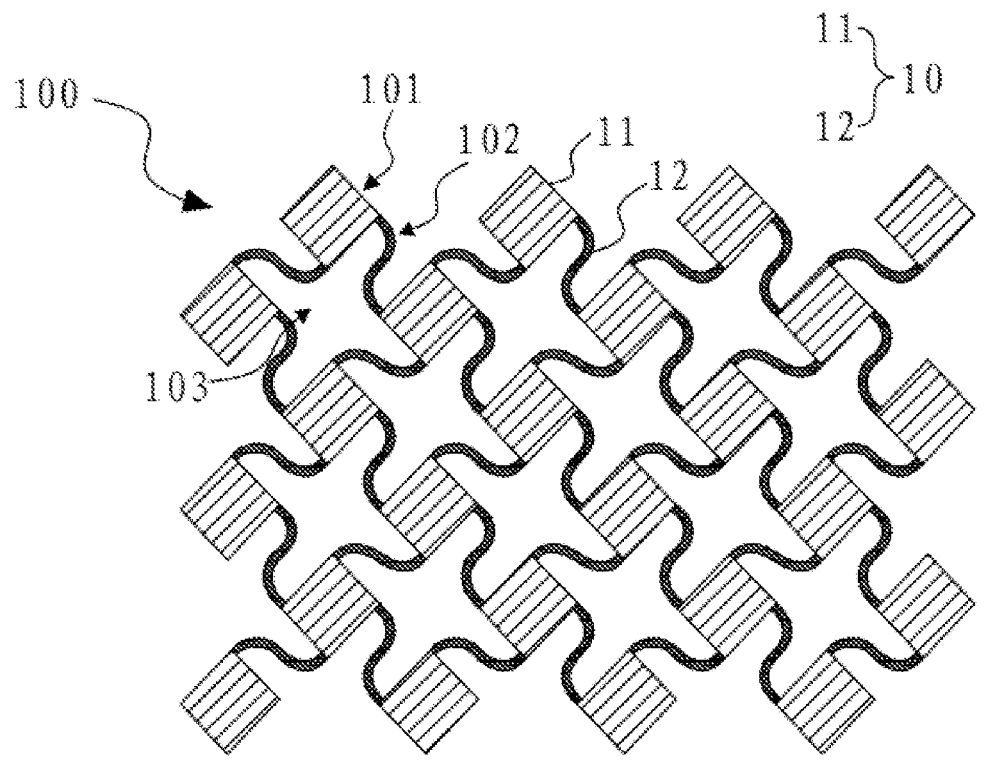
FIG. 1 is a schematic plan view of a stretchable display panel provided by an embodiment of the present application.

The technical solutions in the embodiments of the present application will be clearly and completely described below. Obviously, the described embodiments are only a part of the embodiments of the present application, but not all of the embodiments. Based on the embodiments in the present application, all other embodiments obtained by a person of ordinary skill in the art without creative efforts shall fall within the protection scope of the present application.

In the description of the present invention, the meaning of "a plurality" is two or more unless specifically defined otherwise. In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

The following disclosure provides many different embodiments or examples for realizing different structures of the present application. To simplify the disclosure of the present application, the components and settings of specific examples are described below. Of course, they are only examples and are not intended to limit the application. In addition, the present application may repeat reference numerals and/or reference letters in different examples. Such repetition is for the purpose of simplification and clarity, and does not indicate the relationship between the various embodiments and/or settings discussed. In addition, this application provides examples of various specific processes and materials, but those of ordinary skill in the art may be aware of the applications of other processes and/or the use of other materials.

To address the technical problem that the existing stretchable display panel may be broken when stretched in an arbitrary direction, the present application proposes this embodiment to overcome this defect.

Figure 2:
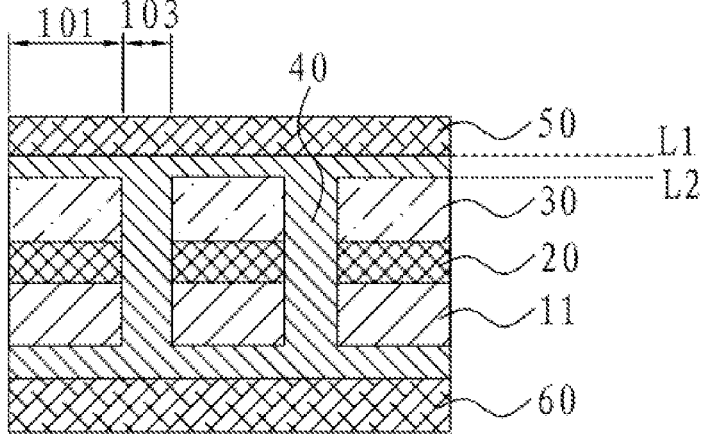
FIG. 2 is a schematic diagram of a film stacking structure of the stretchable display panel provided by an embodiment of the present application.

FIG. 1 and FIG. 2, an embodiment of the present application provides a stretchable display panel 100, including pixel islands 101 distributed in an array, a plurality of connecting bridges 102, and a plurality of hollow areas 103, wherein any one of the connecting bridges 102 is connected to adjacent ones of the pixel islands 101, the hollow areas 103 are arranged between adjacent ones of the connecting bridges 102, and/or, are arranged between adjacent ones of the pixel islands 101.

The stretchable display panel 100 further includes a first flexible support layer 60, and the pixel islands 101 and the connecting bridges 102 are disposed on the first flexible support layer 60. The light-emitting unit 30 included in each pixel islands 101 is configured to implement a display function. Each of the connecting bridges 102 includes a plurality of traces, and opposite ends of the traces are respectively electrically connected to the light-emitting units 30 in adjacent ones of the pixel islands 101 to transmit electrical signals.

Figure 3:
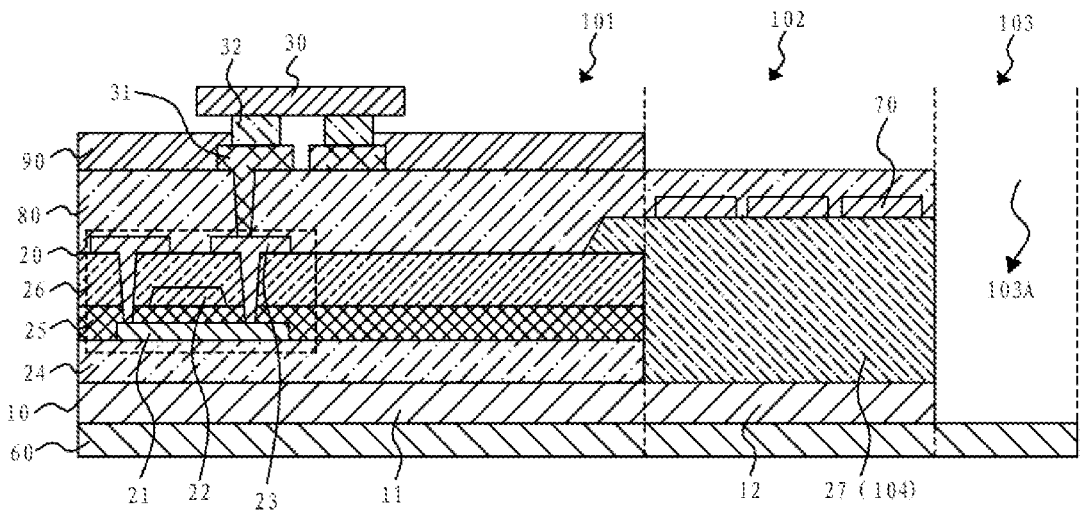
FIG. 3 is a schematic cross-sectional view of the stretchable display panel provided by an embodiment of the present application when a stretchable adhesive layer is not filled.

Referring to FIG. 2 and FIG. 3, each of the hollow areas 103 is provided with a first opening 103A, and the first opening 103A is filled with a stretchable material and the stretchable material 40 is disposed on a side of the first flexible support layer 60 close to one side of the pixel islands 101. By designing peripherals of the pixel islands 101 and the connecting bridges 102 as the hollow areas 103 each with a first opening, a Young's modulus of the entire stretchable display panel 100 can be reduced and a stretchability of the stretchable display panel 100 can be increased. Filling the first opening with the stretchable material 40 can prevent the stretchable display panel 100 from breaking when stretched and can suppress the stretchable display panel 100 from being twisted and deformed when stretched.

Specifically, a shape of each of the connecting bridges 102 may be a curved shape, and more specifically may be a serpentine shape or a wave shape. The connecting bridges 102 may be stretched under an action of an external force. A shape of each of the pixel islands 101 may be a block shape, such as a square shape, a rectangular shape, a rectangular shape, a rhombus shape, etc., so rigidity of the pixel islands 101 will be greater than rigidity of the connecting bridges 102, and the connecting bridges 102 have better stretchability than the pixel islands 101. Each of the hollow areas 103 is surrounded by the plurality of pixel islands 101 and connecting bridges 102 between the pixel islands 101. When the stretchable display panel 100 is stretched under the action of an external force, the curved connecting bridges 102 and the stretchable material 40 are stretched, and the pixel islands 101 are not stretched. During the stretching process, a bending degree of the connecting bridges 102 gradually decreases (developing from a bent state to a straightened state), and an area of the hollow areas 103 gradually increases. After the external force disappears, the stretchable display panel 100 recovers its elastic deformation, and the bending degree of the connecting bridges 102 recovers to a bending degree in a state when the connecting bridges 102 are not stretched.

Referring to FIG. 1 and FIG. 2, the stretchable display panel 100 further includes a flexible substrate 10, the flexible substrate 10 includes substrate islands 11 located on the pixel islands 101, and substrate bridges located on the connecting bridges 102. The substrate bridges 12 connect adjacent ones of the substrate islands 11, and a part of the flexible substrate 10 located at the hollow area 103 is removed to form a part of the first opening 103A.

Referring to FIGS. 2 and 3, each of the pixel islands 101 includes the substrate island 11, a pixel driving circuit 20, and the light-emitting units 30 sequentially stacked on the first flexible support layer, and the light-emitting units 30 are electrically connected to the pixel driving circuit 20; wherein each of the connecting bridges 102 includes the substrate bridge 12 and the plurality of traces 70 sequentially stacked on the first flexible support layer 60, and opposite ends of the substrate bridge 12 are respectively connected to adjacent ones of the substrate islands 11.

Referring to FIG. 2, with respect to a reference plane where the flexible substrate 10 is located (an upper surface or a lower surface of the flexible substrate 10 can be defined as the reference surface), a top surface L1 of the stretchable material 40 must be at least level with a top surface L2 of the light-emitting units 30. That is, the top surface L1 of the stretchable material 40 is higher than or level with the top surface L2 of the light-emitting units 30. Since the part of the flexible substrate 10 located at the hollow area 103 is removed, other layers cannot be formed in the hollow area 103 subsequently, resulting in a step difference between the hollow areas 103 and the pixel islands 101, which is not conducive to flatness and stretchability of the entire stretchable display panel 100. In view of this, the top surface L1 of the stretchable material 40 is designed to be higher than or level with the top surface L2 of the light-emitting unit 30, which not only makes up for the step differences between various regions, but also prevents the stretched display panel 100 from breaking and twisting when stretched.

Referring to FIG. 2, additionally, the stretchable display panel 100 further includes a second flexible support layer 50 disposed on a side of the pixel islands 101 and the connecting bridges 102 away from the first flexible support layer 60. The second flexible support layer 50 can be used as a cover plate to protect the light-emitting units and driving circuits of the stretchable display panel 100. The first flexible support layer can be used as a backplane to support the stretchable display panel 10 and the layers stacked thereon.

Materials of the first flexible support layer 60 and the second flexible support layer 50 are both polymer materials with low elastic modulus and having stretchability. The first flexible support layer 60 and the second flexible support layer may specifically be polydimethylsiloxane (PDMS) elastic substrates.

The first flexible support layer 60 and the second flexible support layer 50 have a blanket structure. During the stretching process, each point of the first flexible support layer 60 and the second flexible support layer 50 is stretched, so Young's modulus of the materials of the first flexible support layer 60 and the second flexible support layer 50 may be less than Young's modulus of the flexible substrate 10, so that the first flexible support layer 60 and the second flexible support layer 50 are relatively easier to stretch.

In the embodiment of the present application, the stretchable material 40 may be a stretchable adhesive, and the stretchable adhesive can also has an attaching function while filling the first opening 103A. The first flexible support layer 60 and the second flexible support layer 50 can be attached to two opposite sides of the pixel islands 101 and the connecting bridges 102 of the stretchable display panel 100 by using the stretchable adhesive. A surface of the stretchable material 40 on the same side as the light-emitting units 30 can protrude from the light-emitting units to facilitate attachment of the second flexible support layer 50; and another surface of the stretchable material 40 on the same side as the flexible substrate 10 can protrude from the flexible substrate 10 to facilitate attachment of the first flexible support layer 60.

The stretchable material 40 may be an optical clear adhesive (OCA), or stretchable optical clear resin or liquid optical adhesive (such as PDMS, OCR) and other transparent adhesive materials.

The stretchable material is configured to provide bonding between the first flexible support layer 60 and the pixel islands 101, between the first flexible support layer 60 and the connecting bridges 102, between the second flexible support layer 50 and the pixel islands 101, and between the second flexible support layer 50 and the connecting bridges 102.

Referring to FIG. 3, FIG. 3 is a schematic cross-sectional view of the stretchable display panel when the stretchable material is not filled yet. The stretchable display panel 100 includes multiple inorganic layers stacked on the substrate island 11, and a part of the multiple inorganic layers is hollowed out in the hollow areas 103 to form a part of the first opening 103A, and a part of the multiple inorganic layers is hollowed out at the connecting bridges 102 to form a second opening 104, and the second opening 104 is filled with an organic filling layer 27.

On the one hand, by removing the multiple inorganic layers from the connecting bridges 102 to form the second opening 104, it can prevent stress on the connecting bridges 102 from penetrating to the pixel islands 101 along the inorganic layer when the stretchable display panel 100 is stretched, which impacts stability of the light-emitting units of the pixel islands 101. On the other hand, by using the organic filling layer 27 to fill the second opening 104, it can relieve the tensile stress of the connecting bridges 102 and improve the tensile performance of the connecting bridges 102.

Referring to FIG. 3, the stretchable display panel 100 includes an active layer 21, a first metal layer, and a second metal layer disposed on the substrate island 11 and arranged in different layers. At least one inorganic layer is provided between every adjacent ones of the substrate island 11, the active layer 21, the first metal layer, and the second metal layer, so as to insulate or block water and oxygen.

Each of the connecting bridges 102 includes a second opening 104 that penetrates through multiple inorganic layers, and the second opening 104 is filled with an organic filling layer 27, which is disposed between the substrate bridge 12 and the traces 70.

Specifically, the pixel driving circuit 20 includes at least one thin film transistor. The thin film transistor may be a low-temperature polysilicon type, an oxide type, or an amorphous silicon type. The thin film transistor may be a top gate structure or a bottom gate structure. The thin film transistor may be a single gate structure or a double gate structure, and the structure and type of the thin film transistor are not particularly limited in embodiments of the present application. It is appreciated that no matter what type of thin film transistor is, when each component of the thin film transistor is prepared on the substrate island 11, preparation of inorganic layers with different functions on different layers will be involved.

Embodiment of the present application takes a top-gate low-temperature polysilicon thin film transistor as an example for description, but is not limited thereto. Specifically, the stretchable display panel 100 includes a buffer layer 24 disposed on the substrate island 11, an active layer 21 disposed on the buffer layer 24, a gate insulating layer 25 disposed on the active layer 21, the first metal layer disposed on the gate insulating layer 25, the interlayer insulating layer 26 disposed on the first metal layer, and the interlayer insulating layer 26 disposed on the second metal layer. The first metal layer includes the gate 22 of the pixel driving circuit 20, and the second metal layer includes the source/drain layer 23. The multiple inorganic layers include the buffer layer 24, the gate insulating layer 25, and the interlayer insulating layer 26. The interlayer insulating layer 26 is provided with the second opening 104 at the connecting bridges 102. The second opening 104 penetrates the interlayer insulating layer 26, the gate insulating layer 25 and the buffer layer 24. The second opening 104 is filled with the organic filling layer 27.

In some embodiments, a surface of the organic filling layer 27 facing away from the flexible substrate 10 may be level with a surface of the interlayer insulating layer 26 facing away from the flexible substrate 10, or a surface of the organic filling layer 27 facing away from the flexible substrate 10 is slightly higher than a surface of the interlayer insulating layer 26 facing away from the flexible substrate 10, so that a surface of the traces 70 provided on the organic filling layer 27 is flat, thereby preventing a large step between the organic filling layer 27 and the interlayer insulating layer 26 to cause the trace 70 to break at the step.

The traces 70 and the source/drain layer 23 can be formed through the same metal manufacturing process to save a photomask manufacturing process. That is, the second metal layer may further include the traces 70. After the organic filling layer 27 is formed, the second metal layer is deposited on the interlayer insulating layer 26 and the organic filling layer 27, and the second metal layer is patterned to form the source electrode, the drain electrode, and each traces 70 at corresponding positions.

In embodiments of the present application, the traces 70 include but are not limited to at least one of signal lines such as scan lines, data lines, power signal lines, and common lines. In other embodiments, a plurality of the traces 70 may be arranged in layers and disposed on different layers in the connecting bridges 102, and adjacent ones of layers of the traces may be separated by an organic layer.

The interlayer insulating layer 26 is further provided with a plurality of first via holes located on the pixel islands 101, and the first via holes sequentially penetrate through the interlayer insulating layer 26 and the gate insulating layer 25 to expose surfaces of opposite ends of the active layer 21, the source and drain of the source/drain layer 23 are respectively connected to the active layer 21 through the corresponding first via holes.

In other embodiments, the thin film transistor may be a bottom gate structure. Specifically, the gate is disposed on the buffer layer, the gate insulating layer is disposed on the gate, the active layer is disposed on the gate insulating layer, the interlayer insulating layer is disposed on the active layer, the source/drain layer is disposed on the interlayer insulating layer, and openings of the interlayer insulating layer at the connecting bridges sequentially penetrate the interlayer insulating layer, the gate insulating layer, and buffer layer.

In other embodiments, the thin film transistor may also have a double-gate structure, the gate includes a first gate and a second gate, the first gate and the second gate are respectively disposed on opposite sides of the active layer, a first insulating layer is provided between the first gate and the active layer, a second insulating layer is provided between the second gate and the active layer, and the interlayer insulating layer is provided on the second gate. An opening of the interlayer insulating layer sequentially penetrates the interlayer insulating layer, the second gate insulating layer, the first gate insulating layer, and the buffer layer.

A material of the active layer 21 in an embodiment of the present application includes any one of low-temperature polysilicon, indium gallium zinc oxide, amorphous silicon, and so on.

Regardless of the structure of the thin film transistor, the second opening 104 is located in each of the connecting bridges 102, and the second opening 104 penetrates through the multiple inorganic layers in the pixel driving circuit 20 and an inorganic layer between the pixel driving circuit 20 and the substrate island 11, and the second opening 104 is filled with the organic filling layer 27.

A material of each of the gate insulating layer 25 and the interlayer insulating layer 26 may include at least one of inorganic materials such as silicon oxide (SiOx) and silicon nitride (SiNx).

The buffer layer 24 may be a multilayered composite film structure or a single-layered film structure, and a material of the buffer layer 24 includes at least one of SiOx, SiNx, or $Al_2O_3$.

A side of the plurality of traces 70 away from the organic filling layer 27 is covered by at least one organic layer, so that upper and lower sides of the traces 70 are protected by organic layers, which can relieve the tensile stress.

Formation of the organic layer on the upper side of the traces 70 can be implemented by preparing the organic layer on the pixel islands 101 while retaining the layers in the connecting bridges 102.

Referring to FIG. 3, at least one organic layer (for example, a planarization layer 80) is provided between the pixel driving circuit 20 and the light-emitting units and the organic layer extends to the connecting bridges 102 to cover the plurality of the traces 70 of the connecting bridges 102.

Specifically, the stretchable display panel 100 further includes a planarization layer 80, a bonding electrode 31, and a passivation layer 90. The planarization layer 80 is disposed on the source/drain layer 23, a bonding electrode 31 is disposed on the planarization layer 80, the light-emitting unit 30 is disposed on the bonding electrode 31, and the passivation layer 90 is disposed on the planarization layer 80. The planarization layer 80 extends into the connecting bridges 102 and covers a plurality of traces 70 of the connecting bridges 102, the passivation layer 90 is an inorganic layer, and part of the passivation layer 90 located at the connecting bridges 102 is hollowed out.

Still referring to FIG. 3, the first opening 103A penetrates the passivation layer 90, the planarization layer 80, the second metal layer, the interlayer insulating layer 26, the first metal layer, the gate insulating layer 25, the active layer 21, and the buffer layer 24. In other words, all layers between the passivation layer 90, the substrate and the passivation layer 90 and the substrate 10 corresponding to the first opening 103A are hollowed out. However, it is appreciated that the first flexible support layer needs not to be hollowed out to play a supporting role.

Figure 4:
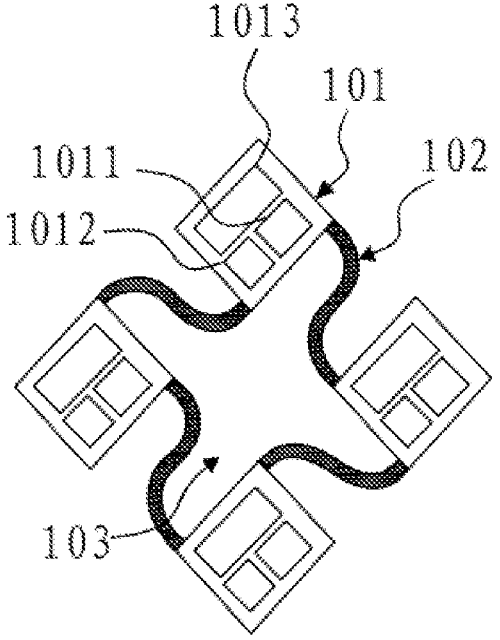
FIG. 4 is a schematic plan view of pixel islands provided by an embodiment of the present application.

Referring to FIG. 4, the light-emitting units 30 of the embodiment of the present application include a first sub-pixel unit 1011, a second sub-pixel unit 1012, and a third sub-pixel unit 1013 with different colors. Areas, arrangements, and shapes of the first sub-pixel unit 1011, the second sub-pixel unit 1012, and the third sub-pixel unit 1013 are not particularly limited. Each of the first sub-pixel unit 1011, the second sub-pixel unit 1012, and the third sub-pixel unit 1013 is selected from one of the red, green, and blue color sub-pixel units, respectively.

The light-emitting unit 30 includes any one of an OLED light-emitting unit, a mini-LED light-emitting unit, and a micro-LED light-emitting unit.

In an embodiment of the present application, referring to FIG. 3, the light-emitting unit 30 may be a micro-LED light-emitting unit or a micro-LED light-emitting unit, and a PN electrode 32 of the light-emitting unit 30 is disposed on and electrically connected to the bonding electrode 31.

The planarization layer 80 is provided with a plurality of second via holes located on the pixel islands 101, and the second via holes penetrate through the planarization layer 80 to expose the source electrode or the drain electrode of the source/drain layer 23. The bonding electrode 31 is connected to the source electrode or the drain electrode of the source/drain layer 23 through the second via hole, so that the pixel driving circuit 20 drives the light-emitting unit 30 to emit light.

In an embodiment of the present application, the light-emitting unit 30 is preferably a micro-LED light-emitting unit. Since an LED chip is transferred to the stretchable display panel 100, the LED chip does not need to undergo a packaging process after the transfer. In addition, a size of micro-LED can reach a level of tens of microns or even a few microns. Micro-LED can achieve high PPI and higher brightness. In addition, micro-LED does not require special packaging technology, and micro-LED is made of inorganic material, whose life and stability are both much stronger than organic molecules of an OLED screen, and micro-LED is not prone to burn-in and aging.

Referring to FIGS. 5 to 12, an embodiment of the present application also provides a method of manufacturing the stretchable display panel in the above embodiments. The manufacturing method includes: S10, forming a flexible substrate on a rigid substrate 200, and defining pixel islands 101, connecting bridges 102, and hollow areas 103 on the flexible substrate 10; S20, forming a pixel driving circuit 20 and light-emitting units 30 on the pixel islands 101, and forming a plurality of tracks on the connecting bridges 102; S30, removing all parts of the flexible substrate 10 and the layers on the flexible substrate 10 at the hollow areas 103; and S40, filling the hollow areas 103 with a stretchable material 40.

The rigid substrate 200 may be a glass substrate, and the flexible substrate 10 may be made of a polyimide material. The polyimide material is coated on an entire surface of the rigid substrate 200 and cured into a film.

The embodiments of the present application take preparation of top-gate thin film transistors as an example for description, and preparation methods of other types of thin film transistors can be referred to the prior art, and will not be described in detail.

Specifically, referring to FIGS. 6-9, formation of the pixel driving circuit 20 includes: forming a buffer layer 24 on the flexible substrate 10; forming a patterned active layer 21 on the buffer layer 24; forming a gate insulating layer 25 on the active layer 21; forming a patterned gate 22 on the gate insulating layer 25; and forming an interlayer insulating layer 26 on the gate 22; wherein the buffer layer 24, the gate insulating layer 25, and the interlayer insulating layer 26 are all inorganic layers.

The buffer layer 24 may be a multilayered composite film structure or a single-layered film structure, and a material of the buffer layer 24 includes at least one of SiOx, SiNx, or Al$_2$O$_3$.

A material of each of the gate insulating layer 25 and the interlayer insulating layer 26 may include at least one of inorganic materials such as silicon oxide (SiOx) and silicon nitride (SiNx).

Figure 7:
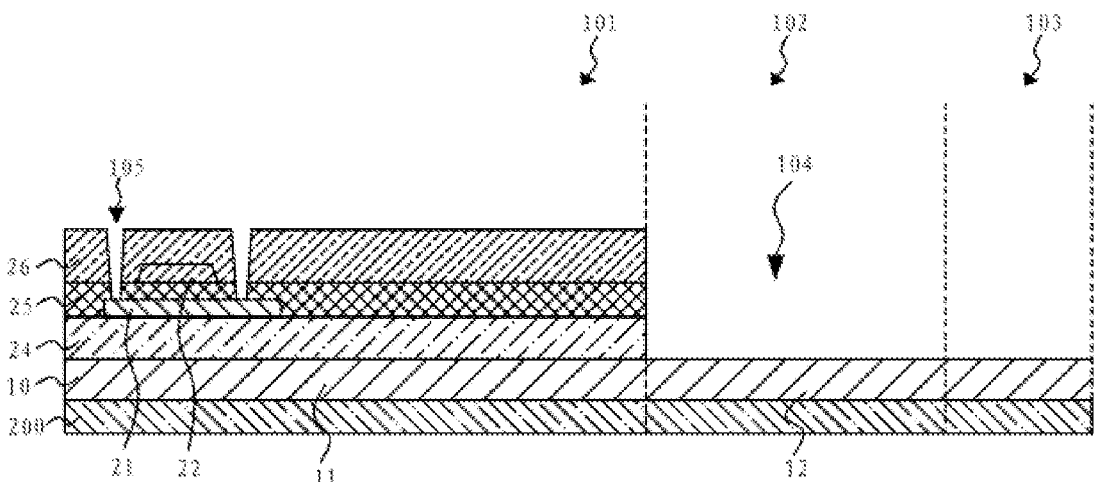

Referring to FIG. 7, the interlayer insulating layer 26, the gate insulating layer 25, and the buffer layer 24 are etched through halftone masks with different light transmittances to remove parts of the layers in the hollow areas 103 and the connecting bridges 102, a second opening 104 is formed in each of the connecting bridges 102, a first via hole 105 is formed in each of the pixel islands 101, the second opening 104 penetrates the interlayer insulating layer 26, the gate insulating layer 25, and the buffer layer 24, and the first via hole 105 sequentially penetrates the interlayer insulating layer 26 and the gate insulating layer 25 to expose surfaces at opposite ends of the active layer 21.

Figure 8:
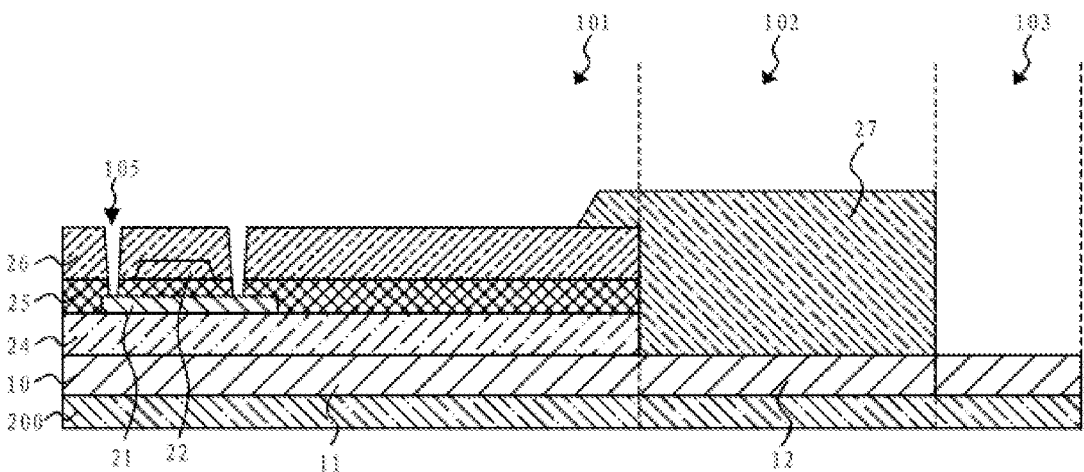

Referring to FIG. 8, afterwards, an organic filling layer 27 is filled in the second opening 104, wherein a surface of the organic filling layer 27 is at least level with a surface of the interlayer insulating layer 26.

Figure 9:
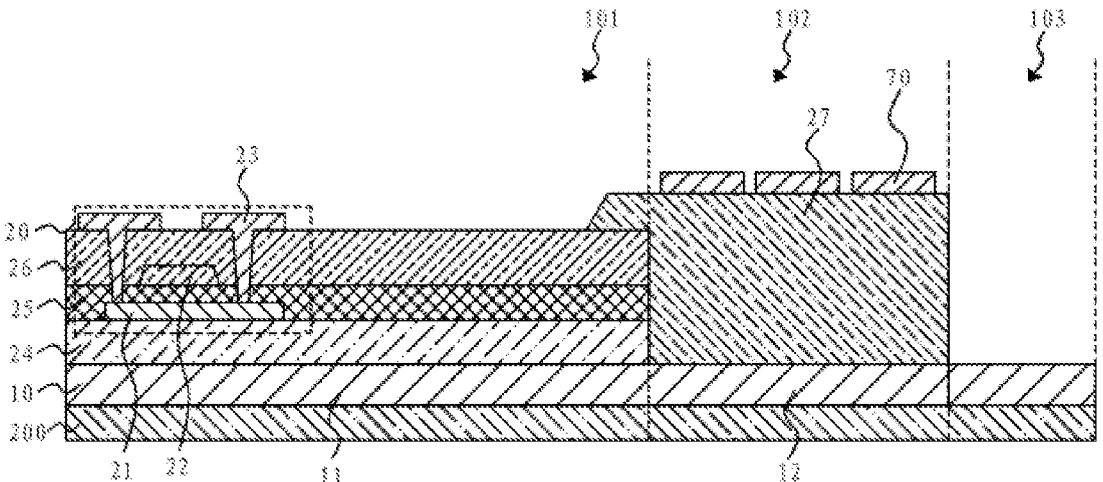

Referring to FIG. 9, a second metal layer is deposited on the interlayer insulating layer 26 and the organic filling layer 27, and the second metal layer is exposed, developed, and etched to form the patterned source/drain layer 23 and the plurality of traces 70.

Figure 10:
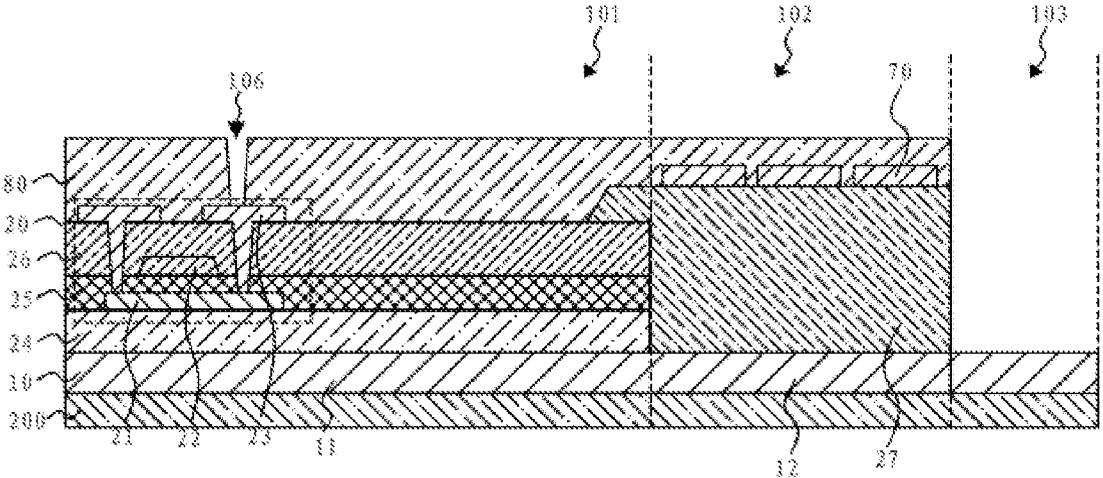
Figure 11:
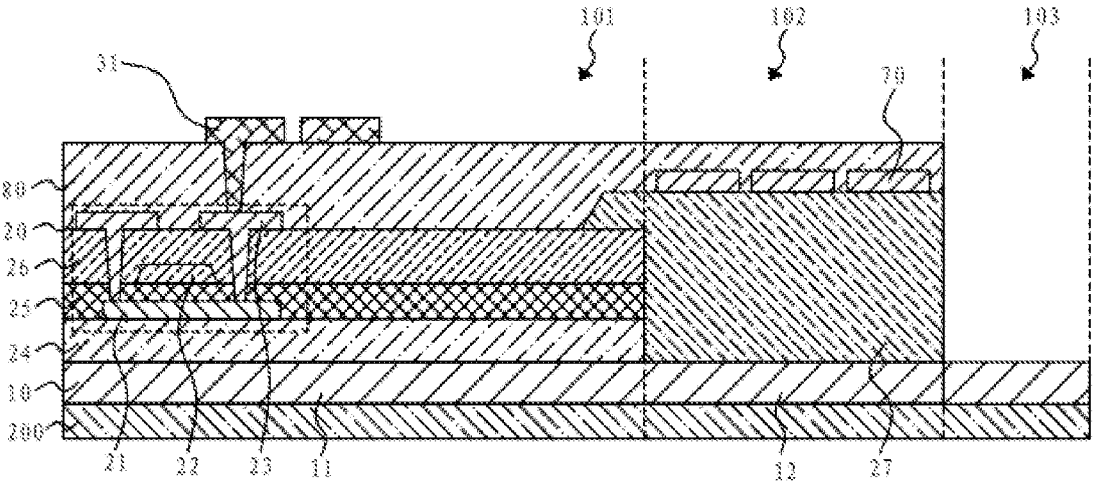
Figure 12:
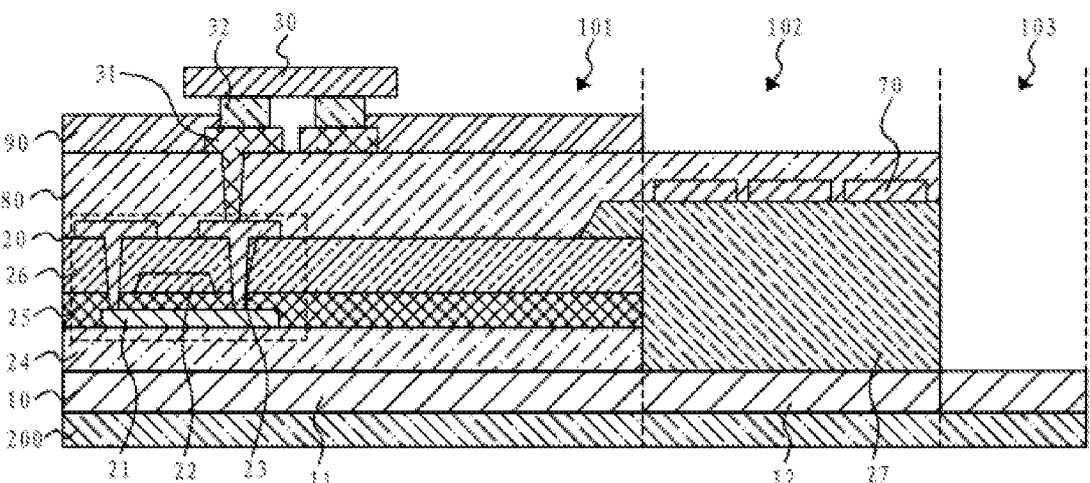

Referring to FIGS. 10-12, formation of the light-emitting unit 30 includes: forming a patterned planarization layer 80 on the source/drain layer 23 and the traces 70; forming a bonding electrode 31 on the planarization layer 80; forming a PN electrode 32 on the bonding electrode 31; bonding a micro-LED chip on the PN electrode 32 to form the light-emitting unit 30.

Referring to FIG. 10, a planarization layer 80 is deposited on the source/drain layer 23, the planarization layer 80 is an organic layer, and the planarization layer 80 is etched to remove its part in the hollow region 103 while retaining the planarization layer 80 on the connecting bridges 102 so that the planarization layer 80 covers the traces 70, and a second via hole 106 is formed in the pixel islands 101, wherein the second via hole 106 exposes the source or drain of the source/drain layer 23.

Referring to FIG. 11, a patterned bonding electrode 31 is formed at the second via hole 106, and the bonding electrode 31 is connected to the underlying source or drain of the source/drain layer 23.

A material of the bonding electrode 31 includes but is not limited to a conductive material, such as ITO, Mo, Cu, Ti/AL/Ti, etc.

Referring to FIG. 12, a patterned passivation layer 90 is formed on the planarization layer 80. The passivation layer 90 includes a receiving groove exposing the bonding electrode 31, and the receiving groove is used to accommodate components related to the light-emitting units 30. The passivation layer 90 is an inorganic layer, and parts of the passivation layer 90 located at the hollow areas 103 and the connecting bridges 102 are all removed.

Afterwards, the PN electrode 32 is coated by evaporation or electroplated on the bonding electrode 31, and the micro-LED chip is bound on the PN electrode 32 through processes such as transfer and bonding to form the light-emitting unit 30.

Figure 13:
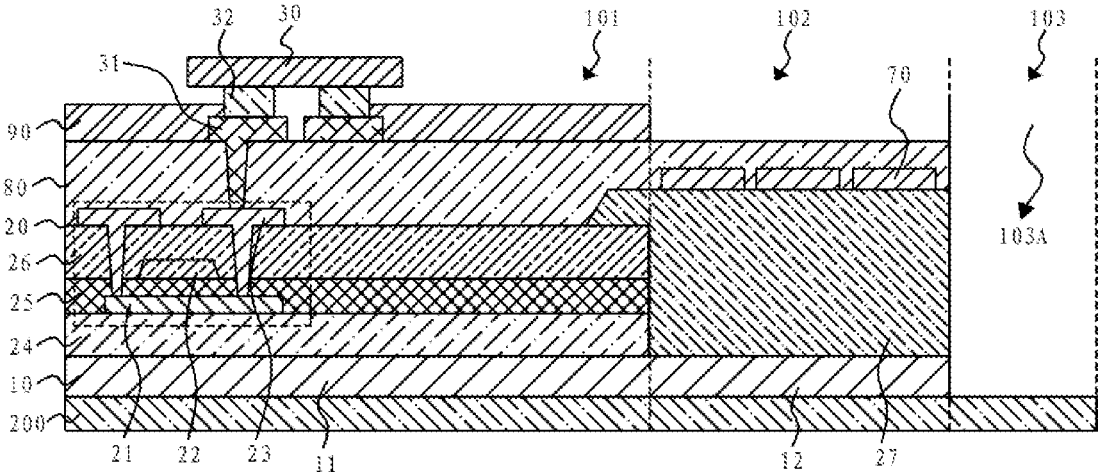

Referring to FIG. 13, after the light-emitting unit 30 is formed, a patterning process is performed on the flexible substrate 10 to form a substrate island 11 and a substrate bridge 12. Specifically, an etching process or a laser cutting process may be used to remove the part of the flexible substrate 10 located at the hollow areas 103 to form a patterned substrate island 11 and a substrate bridge 12.

The patterning process of the flexible substrate 10 may be performed after completing deposition of the material of the flexible substrate 10, or may be performed before transferring the micro-LED chip, which is not particularly limited herein.

After the flexible substrate 10 in the hollow areas 103 is removed, the flexible substrate 10 and the rigid substrate 200 can be peeled off by a laser lift-off process to obtain the stretchable display panel shown in FIG. 3.

Referring to FIG. 1 and FIG. 2, after the layers at the hollow areas 103 are removed, the hollow areas 103 are filled with the stretchable material 40 to improve the rigidity of the patterned flexible substrate 10, and prevent the stretched display panel 100 from breaking when stretched and also suppress the stretchable display panel 100 from being twisted and deformed when stretched. Referring to FIG. 2, the two opposite sides of the stretchable display panel 100 can also be attached to the first flexible support layer 60 and the second flexible support layer 50, respectively.

Figure 14:
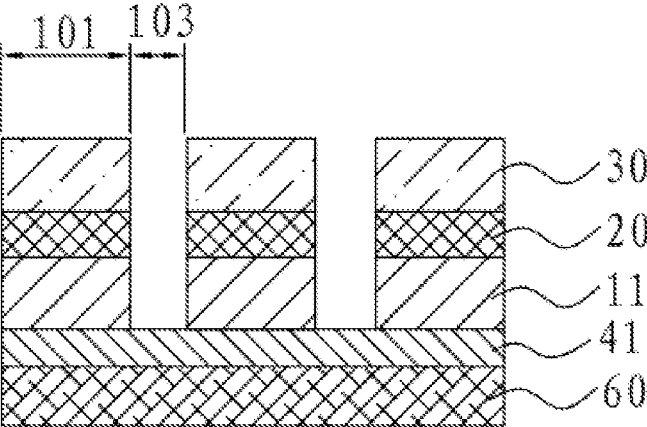
FIG. 14 and FIG. 15 are schematic structural diagrams of the attached first flexible support layer and the second flexible support layer provided by an embodiment of the present application.
Figure 15:
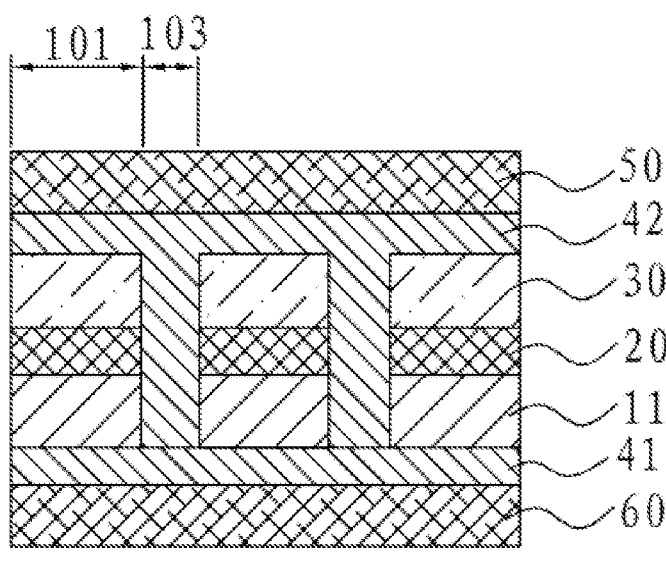

Referring to FIG. 14 and FIG. 15, the stretchable material 40 may be a stretchable adhesive layer, the filling of the stretchable material 40 may be divided into two steps, and the stretchable material 40 may include a first stretchable adhesive layer 41 and the second stretchable adhesive layer 42.

First, the first flexible support layer 60 is attached to a bottom of the stretchable display panel (a side of the flexible substrate 10 facing away from the light-emitting unit 30) through the first stretchable adhesive layer 41; then the hollow areas 103 are filled with the second stretchable adhesive layer 42 until the second stretchable adhesive layer 42 overflows a top of the stretchable display panel (a side of the light-emitting units 30 facing away from the flexible substrate 10) and covers top surfaces of the pixel islands 101 and the connecting bridges 102; and finally the second flexible support layer 50 is attached to the second stretchable adhesive layer 42.

The first flexible support layer 60 is located at a bottom of the stretchable display panel 100 to support the stretchable display panel 100, and the second flexible support layer 50 located on a top of the stretchable display panel 100 can be used to protect the light-emitting unit 30 and the pixel driving circuit 20 of the stretchable display panel.

The second flexible support layer 50 and the first flexible support layer 60 may be elastic substrates, such as polydimethylsiloxane (PDMS) substrates, which have a low elastic modulus and are thus beneficial to improve stretchability of the entire stretchable display panel.

The stretchable display panel provided by the embodiments of the present application includes, but are not limited to, an electronic display product such as an electronic paper, a mobile or tablet computer, a television, a monitor, a notebook computer, a digital photo frame, and a digital camera.

In summary, the embodiments of the present application provide the stretchable display panel, and the stretchable display panel includes the first flexible support layer 60, the pixel islands 101 and the connecting bridges 102 disposed on the first flexible support layer 60, and the hollow areas 103 defined between adjacent connecting bridges 102 and/or between adjacent pixel islands 101. Each of the hollow areas 103 is provided with the first opening 103A, and the first opening 103A is filled with the stretchable material 40. By designing peripherals of the pixel islands and the connecting bridges as the hollow areas each with the first opening 103A, a Young's modulus of the entire stretchable display panel can be reduced and a stretchability of the stretchable display panel can be increased. Filling the first opening 103A with the stretchable material 40 can prevent the stretchable display panel from breaking when stretched and can suppress the stretchable display panel from being twisted and deformed when stretched.

In the above embodiments, the descriptions of each embodiment have their own emphasis. The parts that are not described in detail in an embodiment can be referred to the detailed descriptions in other embodiments above, which will not be repeated herein for brevity.

The stretchable display panel provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A stretchable display panel, comprising:
a first flexible support layer;
a plurality of pixel islands disposed on the first flexible support layer, wherein each of the pixel islands comprises a plurality of light-emitting units;
a plurality of connecting bridges disposed on the first flexible support layer, wherein each of the connecting bridges connects adjacent ones of the pixel islands, each of the connecting bridges comprises a plurality of traces, and opposite ends of each of the traces are electrically connected to the light-emitting units in adjacent ones of the pixel islands, respectively;

a plurality of hollow areas defined between adjacent ones of the connecting bridges, and/or defined between adjacent ones of the pixel islands; and
a second flexible support layer disposed on a side of the pixel islands and the connecting bridges away from the first flexible support layer,
wherein each of the hollow areas is provided with a first opening, the first opening is filled with a stretchable material, and the stretchable material is disposed on a side of the first flexible support layer close to the pixel islands;
wherein each of the pixel islands comprises a substrate island, a pixel driving circuit, and the light-emitting units sequentially stacked on the first flexible support layer, and the light-emitting units are electrically connected to the pixel driving circuit; and
wherein each of the connecting bridges further comprises a substrate bridge and the plurality of traces sequentially stacked on the first flexible support layer, and opposite ends of the substrate bridge are respectively connected to adjacent ones of the substrate islands;
wherein the stretchable display panel further comprises an active layer, a first metal layer, and a second metal layer disposed on the substrate island and arranged in different layers, and at least one inorganic layer is provided between every adjacent ones of the substrate islands, the active layer, the first metal layer, and the second metal layer; and
wherein each of the connecting bridges further comprises a second opening, the second opening penetrates through multiple layers of the inorganic layer, the second opening is filled with an organic filling layer, and the organic filling layer is disposed between the substrate bridge and the traces.

2. The stretchable display panel according to claim 1, wherein the second metal layer comprises a source/drain layer of the pixel driving circuit and the traces.

3. The stretchable display panel according to claim 1, wherein the stretchable display panel further comprises:
a buffer layer disposed on the substrate island;
the active layer disposed on the buffer layer;
a gate insulating layer disposed on the active layer;
the first metal layer disposed on the gate insulating layer;
an interlayer insulating layer disposed on the first metal layer; and
the second metal layer disposed on the interlayer insulating layer,
wherein the buffer layer, the gate insulating layer, and the interlayer insulating layer are all inorganic layers, and the second opening penetrates the interlayer insulating layer, the gate insulating layer, and the buffer layer.

4. The stretchable display panel according to claim 3, wherein the stretchable display panel further comprises:
a planarization layer disposed on the second metal layer, and the light-emitting units being disposed on the planarization layer; and
a passivation layer disposed on the planarization layer,
wherein the first opening penetrates the passivation layer, the planarization layer, the second metal layer, the interlayer insulating layer, the first metal layer, the gate insulating layer, the active layer, and the buffer layer.

5. The stretchable display panel according to claim 4, wherein the stretchable material filled in the first opening is an optical clear adhesive (OCA).

6. The stretchable display panel according to claim 4, wherein the planarization layer is an organic layer, and the planarization layer extends to the connecting bridges and covers the plurality of traces of the connecting bridges.

7. The stretchable display panel according to claim 1, wherein the stretchable material is configured to provide bonding between the first flexible support layer and the pixel islands, between the first flexible support layer and the connecting bridges, and between the second flexible support layer and the connecting bridges.

8. A stretchable display panel, comprising:

a first flexible support layer;

a plurality of pixel islands disposed on the first flexible support layer, wherein each of the pixel islands comprises a plurality of light-emitting units;

a plurality of connecting bridges disposed on the first flexible support layer, wherein each of the connecting bridges connects adjacent ones of the pixel islands, each of the connecting bridges comprises a plurality of traces, and opposite ends of each of the traces are electrically connected to the light-emitting units in adjacent ones of the pixel islands, respectively; and a plurality of hollow areas defined between adjacent ones of the connecting bridges, and/or defined between adjacent ones of the pixel islands, wherein each of the hollow areas is provided with a first opening, the first opening is filled with a stretchable material, and the stretchable material is disposed on a side of the first flexible support layer close to the pixel islands;

wherein each of the pixel islands comprises a substrate island, a pixel driving circuit, and the light-emitting units sequentially stacked on the first flexible support layer, and the light-emitting units are electrically connected to the pixel driving circuit; and wherein each of the connecting bridges further comprises a substrate bridge and the plurality of traces sequentially stacked on the first flexible support layer, and opposite ends of the substrate bridge are respectively connected to adjacent ones of the substrate islands;

wherein the stretchable display panel further comprises an active layer, a first metal layer, and a second metal layer disposed on the substrate island and arranged in different layers, and at least one inorganic layer is provided between every adjacent ones of the substrate islands, the active layer, the first metal layer, and the second metal layer;

wherein each of the connecting bridges further comprises a second opening, the second opening penetrates through multiple layers of the inorganic layer, the second opening is filled with an organic filling layer, and the organic filling layer is disposed between the substrate bridge and the traces;

wherein the second metal layer comprises a source/drain layer of the pixel driving circuit and the traces;

wherein the stretchable display panel further comprises:

a buffer layer disposed on the substrate island;

the active layer disposed on the buffer layer;

a gate insulating layer disposed on the active layer;

the first metal layer disposed on the gate insulating layer;

an interlayer insulating layer disposed on the first metal layer; and the second metal layer disposed on the interlayer insulating layer, wherein the buffer layer, the gate insulating layer, and the interlayer insulating layer are all inorganic layers, and the second opening penetrates the interlayer insulating layer, the gate insulating layer, and the buffer layer.

9. The stretchable display panel according to claim 8, wherein the stretchable display panel further comprises:

a planarization layer disposed on the second metal layer, and the light-emitting units being disposed on the planarization layer; and a passivation layer disposed on the planarization layer, wherein the first opening penetrates the passivation layer, the planarization layer, the second metal layer, the interlayer insulating layer, the first metal layer, the gate insulating layer, the active layer, and the buffer layer.

10. The stretchable display panel according to claim 9, wherein the stretchable material filled in the first opening is an optical clear adhesive (OCA).

11. The stretchable display panel according to claim 9, wherein the planarization layer is an organic layer, and the planarization layer extends to the connecting bridges and covers the plurality of traces of the connecting bridges.

12. The stretchable display panel according to claim 8, wherein the stretchable display panel further comprises a second flexible support layer disposed on a side of the pixel islands and the connecting bridges away from the first flexible support layer.

13. A stretchable display panel, comprising:

a first flexible support layer;

a plurality of pixel islands disposed on the first flexible support layer, wherein each of the pixel islands comprises a plurality of light-emitting units;

a plurality of connecting bridges disposed on the first flexible support layer, wherein each of the connecting bridges connects adjacent ones of the pixel islands, each of the connecting bridges comprises a plurality of traces, and opposite ends of each of the traces are electrically connected to the light-emitting units in adjacent ones of the pixel islands, respectively; and a plurality of hollow areas defined between adjacent ones of the connecting bridges, and/or defined between adjacent ones of the pixel islands, wherein each of the hollow areas is provided with a first opening, the first opening is filled with a stretchable material, and the stretchable material is disposed on a side of the first flexible support layer close to the pixel islands;

wherein the stretchable display panel further comprises a second flexible support layer disposed on a side of the pixel islands and the connecting bridges away from the first flexible support layer;

wherein the stretchable material is configured to provide bonding between the first flexible support layer and the pixel islands, between the first flexible support layer and the connecting bridges, and between the second flexible support layer and the connecting bridges.

14. The stretchable display panel according to claim 13, wherein the stretchable display panel further comprises an active layer, a first metal layer, and a second metal layer disposed on the substrate island and arranged in different layers, and at least one inorganic layer is provided between every adjacent ones of the substrate islands, the active layer, the first metal layer, and the second metal layer; and wherein each of the connecting bridges further comprises a second opening, the second opening penetrates through multiple layers of the inorganic layer, the second opening is filled with an organic filling layer, and the organic filling layer is disposed between the substrate bridge and the traces.

15. The stretchable display panel according to claim 14, wherein the second metal layer comprises a source/drain layer of the pixel driving circuit and the traces.

16. The stretchable display panel according to claim 14, wherein the stretchable display panel further comprises:

a buffer layer disposed on the substrate island;

the active layer disposed on the buffer layer;

a gate insulating layer disposed on the active layer;

the first metal layer disposed on the gate insulating layer;

an interlayer insulating layer disposed on the first metal layer; and the second metal layer disposed on the interlayer insulating layer, wherein the buffer layer, the gate insulating layer, and the interlayer insulating layer are all inorganic layers, and the second opening penetrates the interlayer insulating layer, the gate insulating layer, and the buffer layer.

17. The stretchable display panel according to claim 16, wherein the stretchable display panel further comprises:

a planarization layer disposed on the second metal layer, and the light-emitting units being disposed on the planarization layer; and a passivation layer disposed on the planarization layer, wherein the first opening penetrates the passivation layer, the planarization layer, the second metal layer, the interlayer insulating layer, the first metal layer, the gate insulating layer, the active layer, and the buffer layer.

18. The stretchable display panel according to claim 17, wherein the stretchable material filled in the first opening is an optical clear adhesive (OCA).

* * * * *